United States Patent [19]
Yangkuai

[11] Patent Number: 5,742,486
[45] Date of Patent: Apr. 21, 1998

[54] REUSABLE ELECTRONIC CIRCUIT BUILDING SET WITH INTERCHANGEABLE MODULAR COMPONENTS

[75] Inventor: Li Yangkuai, Hebei, China

[73] Assignee: Xiaoli Zhou, Bellevue, Wash.

[21] Appl. No.: 590,316

[22] Filed: Jan. 23, 1996

[51] Int. Cl.$^6$ .............................. G09B 23/18; H05K 7/02; H05K 7/10
[52] U.S. Cl. .......................... 361/807; 361/808; 361/811; 434/224; 434/301; 446/91
[58] Field of Search ...................... 361/729, 731, 361/807, 808, 811; 434/300, 301, 379, 224; 446/91, 90, 120, 121

[56] References Cited

U.S. PATENT DOCUMENTS

| | | | |
|---|---|---|---|
| 3,062,991 | 11/1962 | Kaidan | 434/301 |
| 3,175,304 | 3/1965 | Och et al. | 434/224 |
| 3,268,774 | 8/1966 | Ortner | 361/729 |
| 3,514,872 | 6/1970 | Bradley | 434/224 |
| 3,540,135 | 11/1970 | Alcosser et al. | 434/224 |
| 3,548,261 | 12/1970 | Chambers | 434/301 |
| 4,376,538 | 3/1983 | Keenan | 434/224 |

*Primary Examiner*—Leo P. Picard
*Assistant Examiner*—John B. Vigushin
*Attorney, Agent, or Firm*—David L. Tingey

[57] ABSTRACT

An assembly board with a matrix of depending pegs uniformly spaced on orthogonal intersecting lines with pegs at intersections at half the distance adapted to selectively receive from a set, detachable and reusable electrical components housed in uniformly-shaped casings comprising at least 2 electrical connections uniformly spaced for interchangeability of components and stackable at the connections. Components with 2 connections are elongated with connection terminals at each end a standard distance apart. Components requiring a third connection are constructed in an equilateral triangular housing with a base having 2 terminals spaced apart the standard distance and a third connection half the standard distance from the base. Components having 4 or more connections are housed in a rectangular housing having terminals at corners with first opposing sides having terminals the standard distance apart at corners and the sides being spaced apart half the standard distance. To facilitate connections between the various components, a plurality of wire connectors in the standard casing form are also provided.

16 Claims, 6 Drawing Sheets

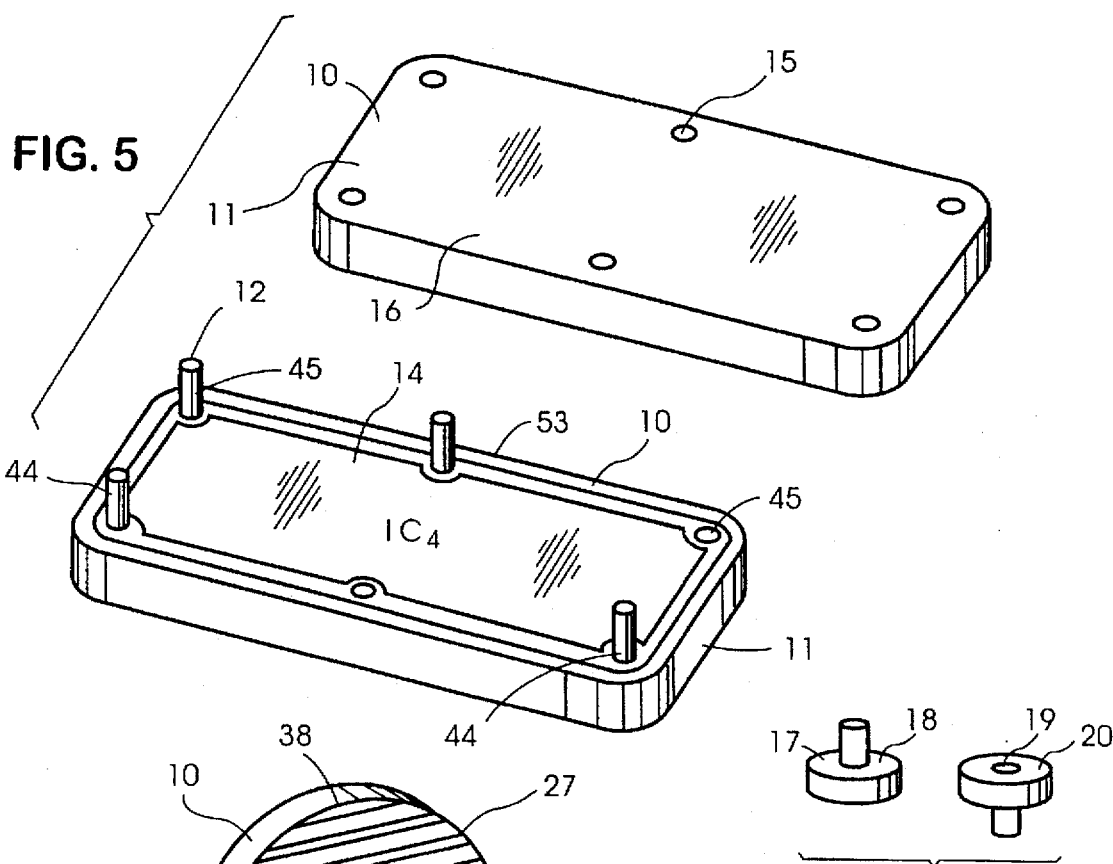
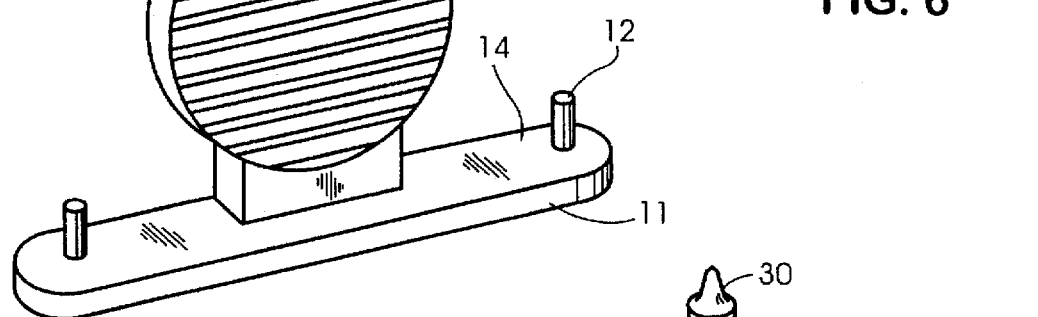
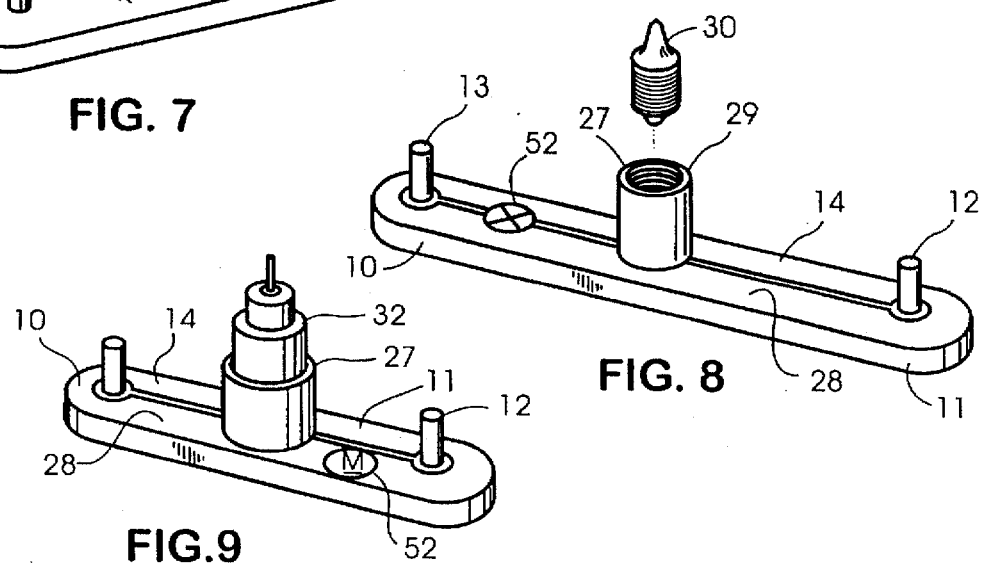

REUSABLE ELECTRONIC CIRCUIT BUILDING SET WITH INTERCHANGEABLE MODULAR COMPONENTS

BACKGROUND

1. Field of the Invention

This invention relates generally to assemblies for constructing electrical circuits and, more particularly, to assemblies with modular uniformly interconnecting components for forming electrical circuits.

2. Description of the Prior Art

It is known to have small, uniform building blocks suitable for children. Often, such blocks have means for interconnection between them, sometimes between upper and lower surfaces, sometimes with interlinking ends. The blocks are generally of uniform length and width, or subsets of uniform length and width, all with common means of interconnecting.

It is also known to have electrical circuit assemblies which usually comprise components, connecting clips, and wires. Components may include various resistors, capacitors, switches, battery, and output components such as lights and speakers. Components are generally standard production stock items used in the electronic industry from which are assembled an assortment useful in composing simple circuits. Such assemblies are useful for teaching elementary electronics and circuit design. However, with standard stock components, wire connections tend to break off or break loose from the component (e.g., resistor or capacitor) and connecting wires quickly become unusable after a few applications.

It is the object of the present invention to combine features of uniform interconnecting building blocks with simple electrical components to provide an assembly of reusable electrical components that selectively interconnect to yield a constructed electrical circuit. Such an assembly would be a reusable educational tool for elementary electrical circuit design.

SUMMARY OF THE INVENTION

The object of the invention is achieved in a set of electrical components housed in uniformly-constructed casings. The casings with components having 2 electrical connections are elongated and include electrical connection terminals at each end a distance apart comprising terminal posts and terminal bores on a component top side and bottom side respectively. Components requiring a third connection are constructed in an equilateral triangular housing with a base having 2 terminals spaced apart the twice standard distance and a third connection half the twice standard distance from the base. Components having 4 or more connections are housed in a rectangular housing having terminals at corners with first opposing sides having terminals the standard distance apart at corners and the sides being spaced apart the standard distance.

To facilitate assembly, an assembly board is provided with a matrix of depending pegs uniformly spaced on orthogonal intersecting lines with pegs at intersections at half the distance. The pegs are thus positioned to receive and attach electrical components sized and spaced equivalent to terminal posts. Matching the pegs are bores in the component casings under the electrical terminals sized to receive pegs to secure the respective component on the board or terminal posts so that components can stack at the terminals for multiple component connection at a circuit point.

The set is designed to teach introductory circuit design and illustrate basic circuit principles, such as parallel and series circuits and effects, capacitance, resistance, electricity, thus semiconductor microelectronics. To that end, encased in uniformly shaped casings are a variety of components including fundamental components such as resistors of capacitors in a variety of resistances and capacitances, switches, and batterys. Also included in the same shaped casings are output components such as light bulb sockets (and bulb), light emitting diodes (LED), motors, and speakers. Also provided are more specialty circuit components such as PNP and NPN semiconductor triodes, a transistor, a variable resistor, a low frequency amplifier, and a diode. More advanced components are also provided in several integrated circuits including a radio, an alarm, and a musical integrated circuit. Components also lending themselves toward experimentation include a microphone, a touching switch that allows a user to manually bridge a gap between contact plates, a dry reed tube that closes an open circuit through a magnet, externally applied by a user, that pulls internal elements into contact, and a tuning circuit that balances a RC (resistor/capacitor) circuit by adjusting an external wheel. To facilitate connections between the various components, a plurality of wire connectors in the standard casing form are provided. Because multiple-terminal components (3 and more) have terminals at the standard distance, a plurality of wire connectors are provided with terminals spaced apart by said the standard distance.

BRIEF DESCRIPTION OF THE DRAWINGS

FIG. 5 is top and bottom perspective views of a uniform integrated circuit component having 5 terminals on a top side and receiving bores on the bottom side to receive terminals of another uniform component.

FIG. 6 is top and bottom perspective views of a uniform spacer component.

FIG. 7 is a front perspective of a speaker component.

FIG. 8 is a top perspective view of a uniform light socket component with light bulb.

FIG. 9 is a top perspective view of a uniform motor component.

DETAILED DESCRIPTION OF THE PREFERRED EMBODIMENT

Figure 1:
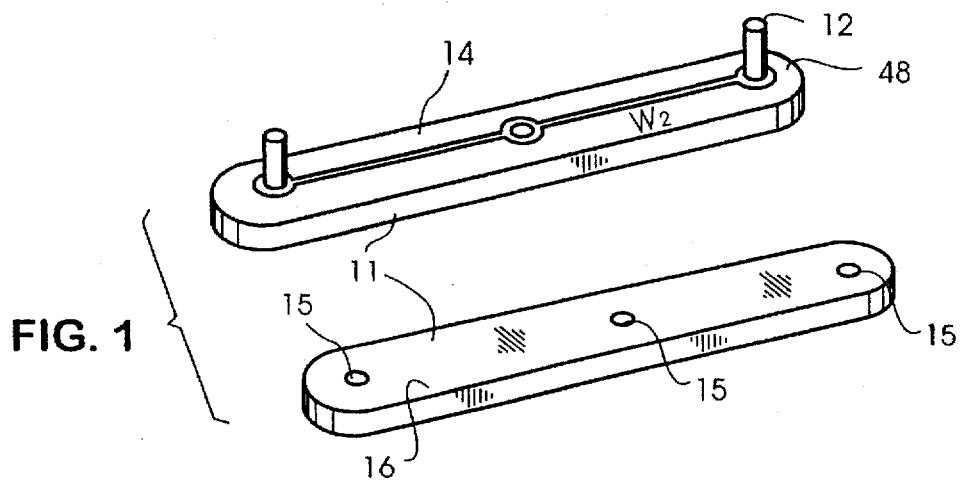
FIG. 1 is a perspective view of a uniform wire component showing top and bottom views.
Figure 2:
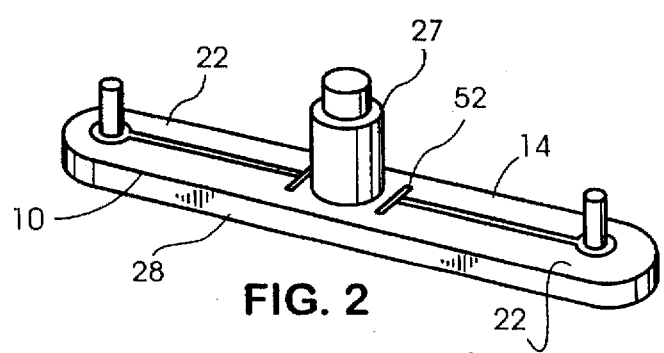
FIG. 2 is a top perspective view of a uniform capacitor component.
Figure 3:
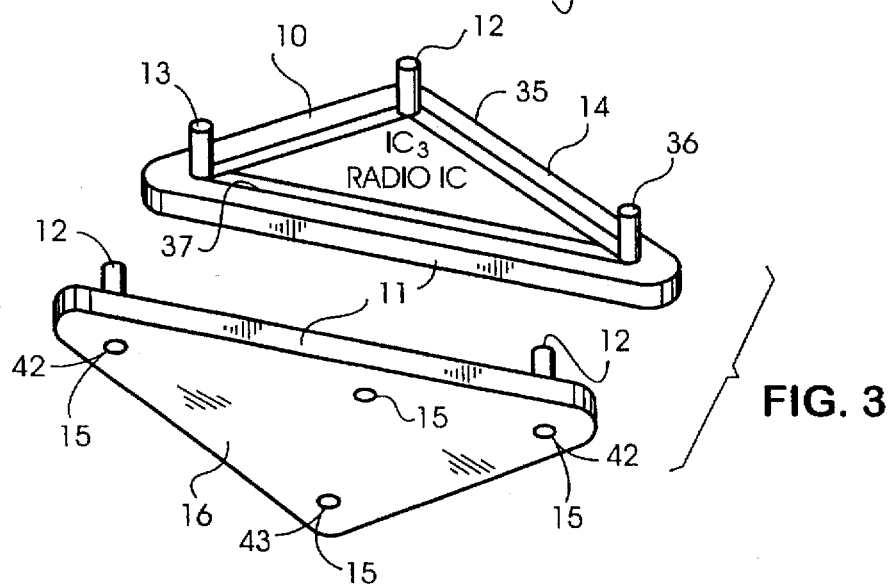
FIG. 3 are top and bottom perspective views of a uniform radio integrated circuit component having 3 terminals.
Figure 4:
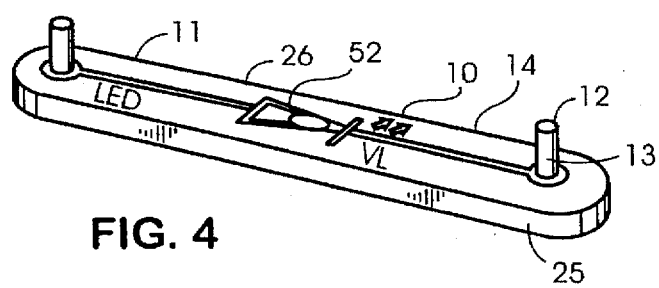
FIG. 4 is a top perspective view of a uniform light emitting diode component.
Figure 10:
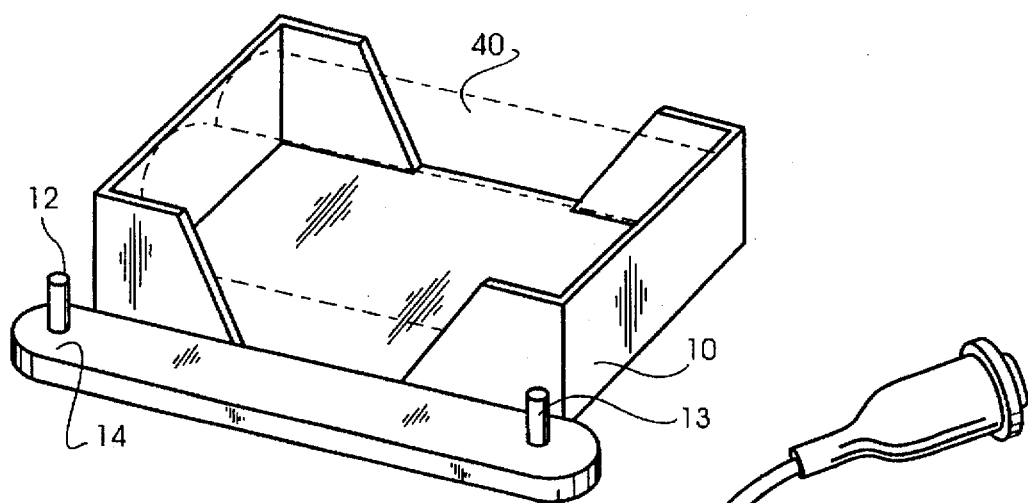
FIG. 10 is a top perspective view of a uniform power source component for holding batteries.
Figure 11:
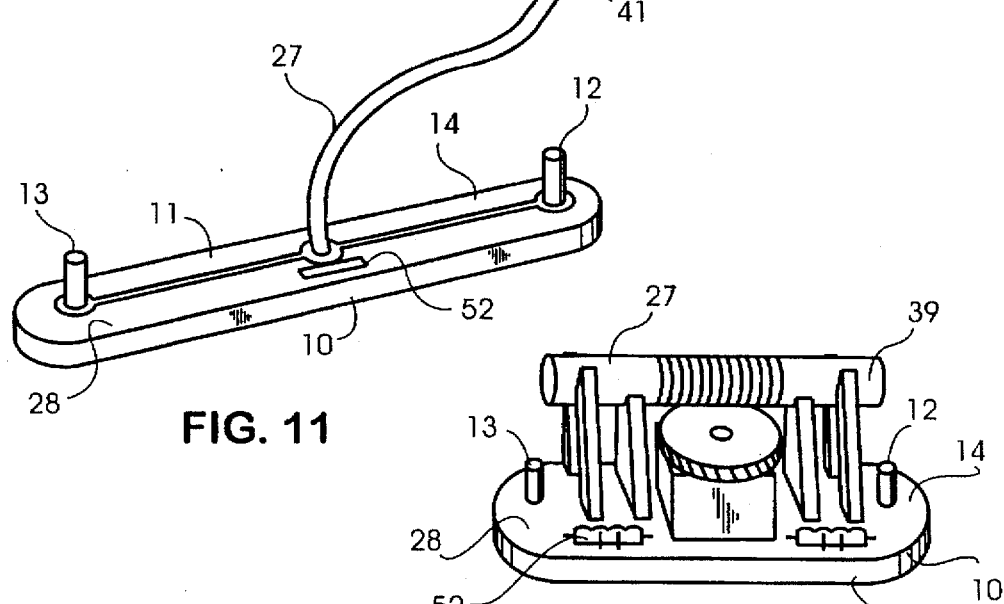
FIG. 11 is a top perspective view of a uniform microphone component.
Figure 12:
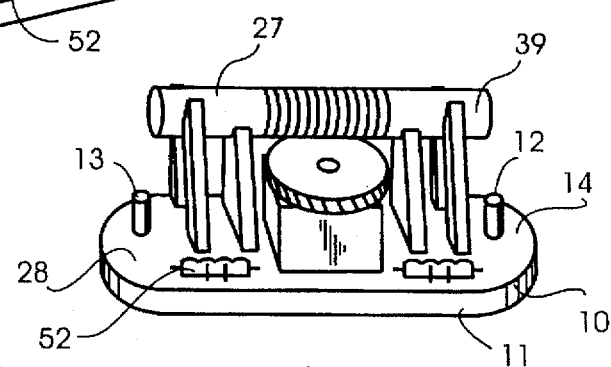
FIG. 12 is a top perspective view of a uniform tuning circuit component.
Figure 13:
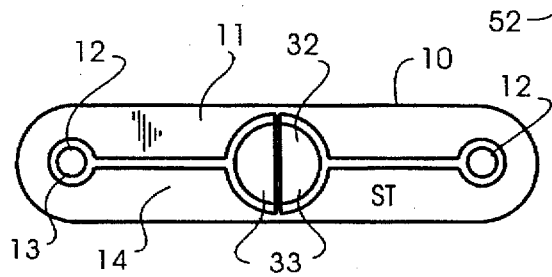
FIG. 13 is a top perspective view of a uniform touch switch component.
Figure 14:
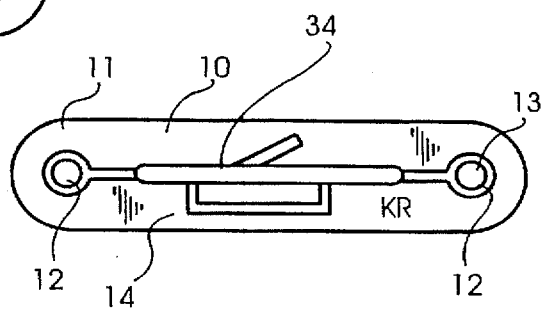
FIG. 14 is a top perspective view of a uniform dry reed tube component.
Figure 15:
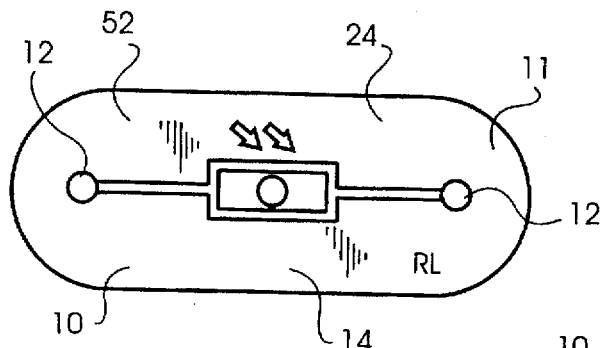
FIG. 15 is a top perspective view of a uniform photoresister component.
Figure 16:
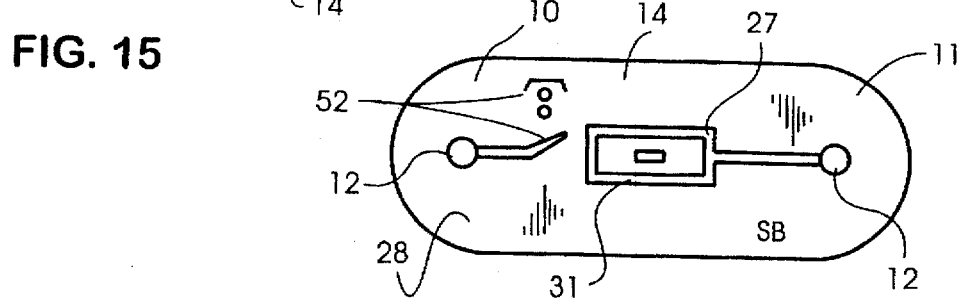
FIG. 16 is a top perspective view of a uniform key button switch component.
Figure 17:
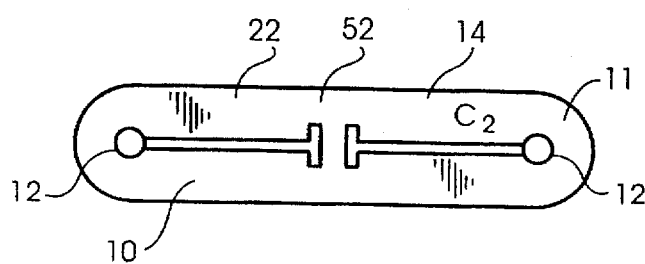
FIG. 17 is a top perspective view of a uniform capacitor component.
Figure 18:
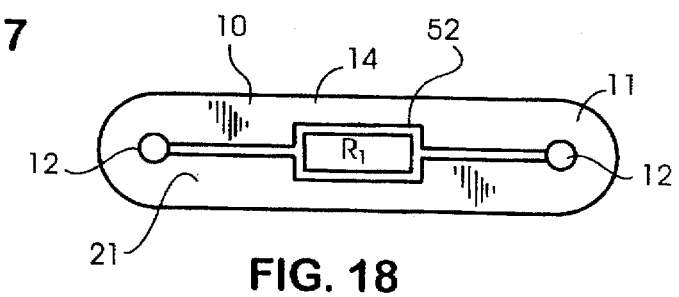
FIG. 18 is a top perspective view of a uniform resistor component.
Figure 19:
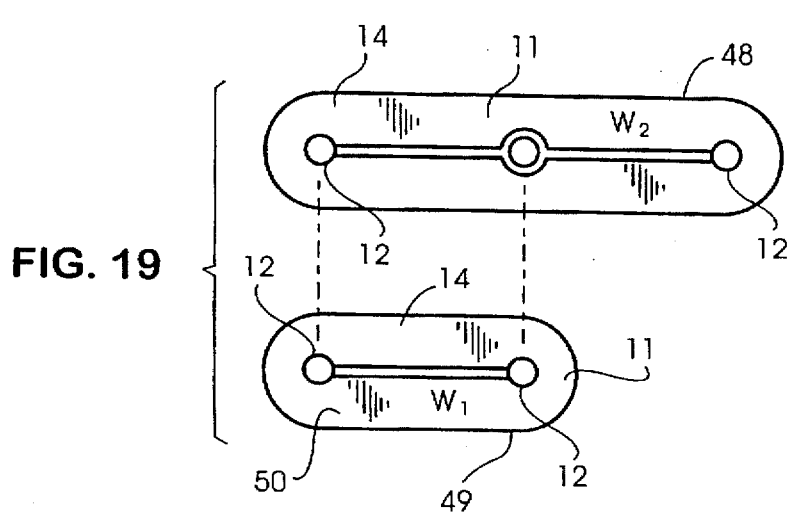
FIG. 19 is a top perspective view of a first uniform wire component with terminal posts spaced apart twice a standard distance and second uniform wire component with terminal posts spaced apart the standard distance.
Figure 20:
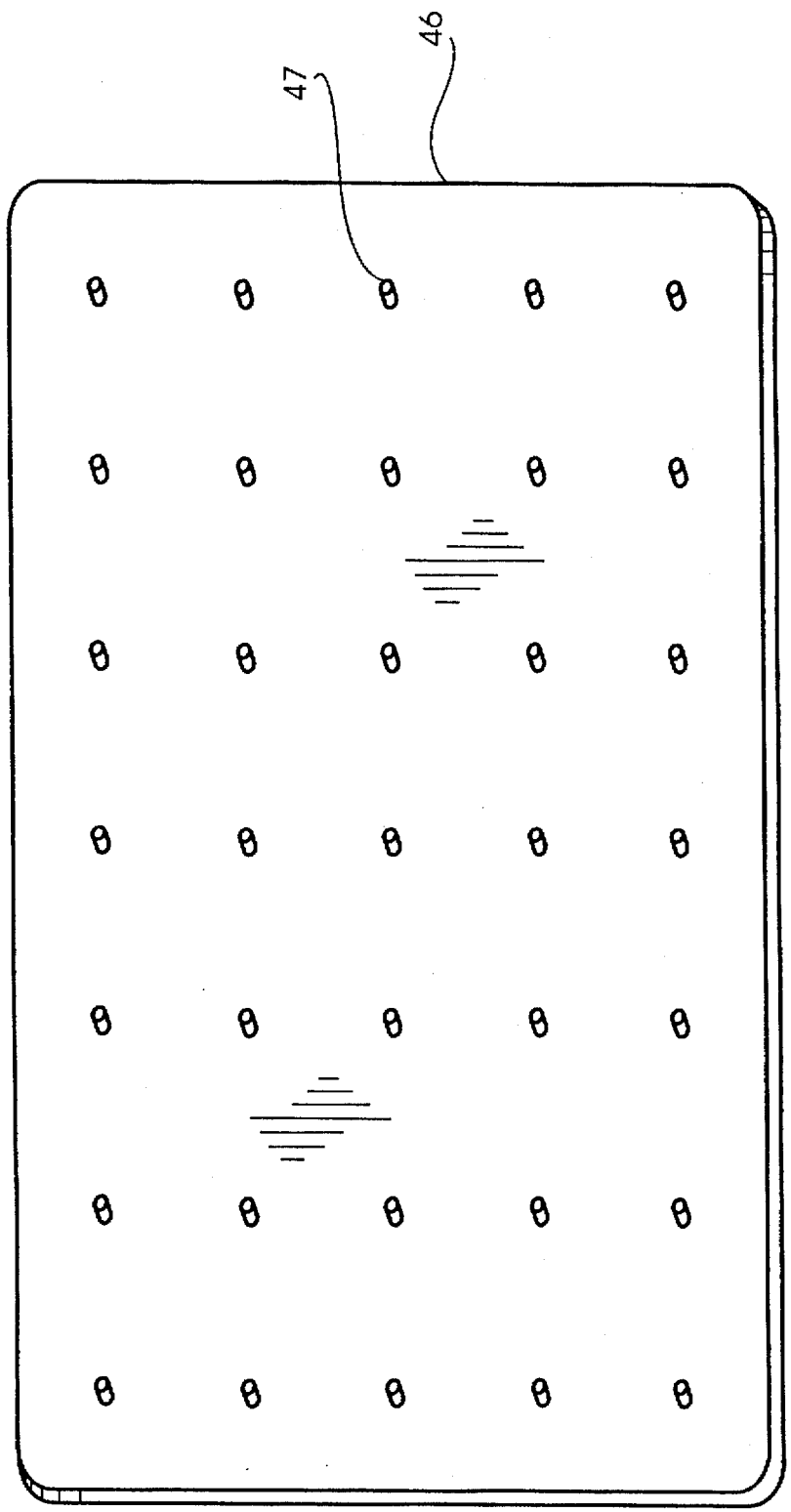
FIG. 20 is a top perspective view of an assembly board.
Figure 22:
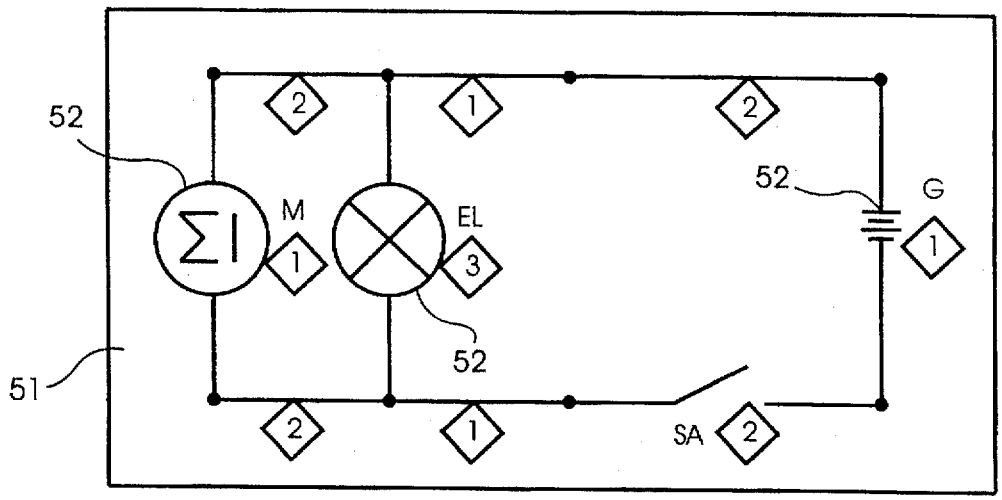
FIG. 22 is a sample schematic diagram guide.
Figure 23:
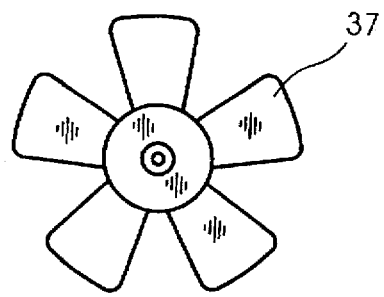
FIG. 23 is a top view of a fan mountable on the electrical motor.
Figure 21:
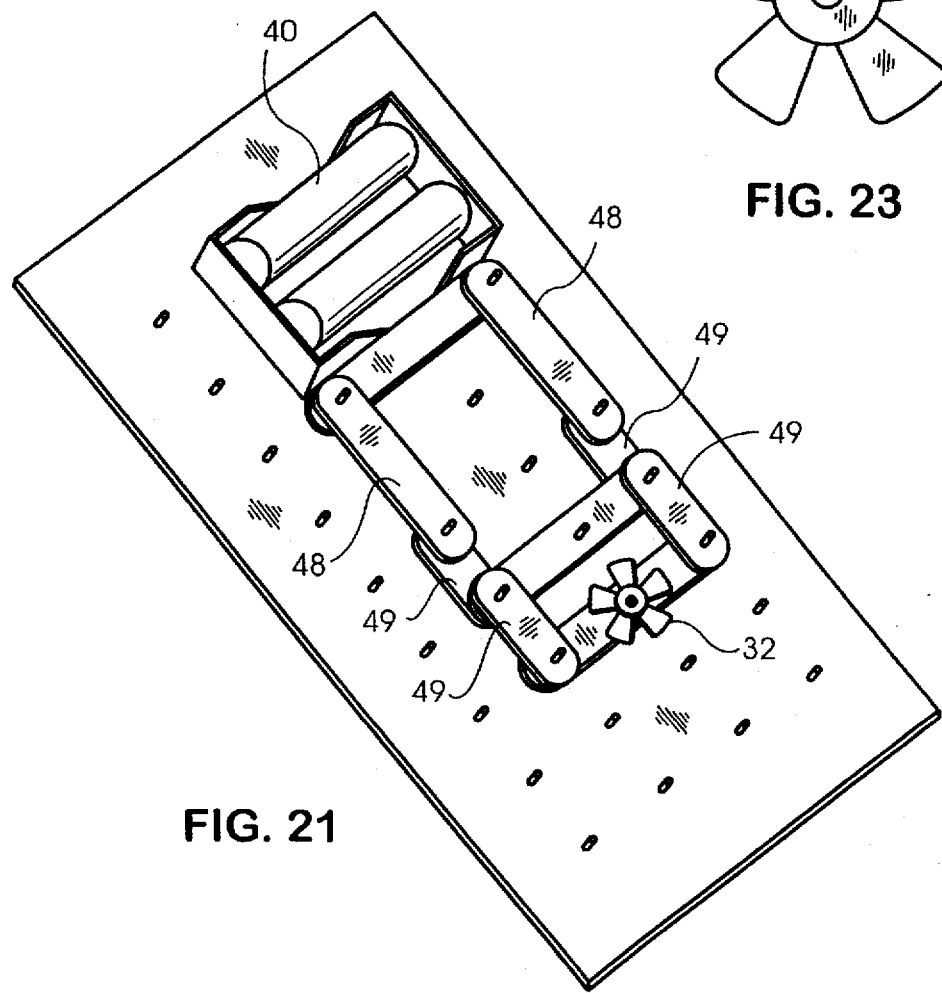
FIG. 21 is a top perspective view of a sample elementary electrical circuit assembled on the assembly boarch of selective uniform components.

The modular electrical circuit assembly of the present invention comprises a plurality of interconnectable electrical components 10 each encased in a uniform base 11 and having 2 or more electrical terminals 12 connected to each component spaced apart on the base twice a standard distance. The terminals 12 include an electrically-conducting post 13 extending vertically from a base top side 14 and a receiving bore 15 with electrically-conducting circumference under each post 13 in a base bottom side 16 opposite the top side 14 adapted to disconnectably receive a post 13 from another component in electrical connection. The components 10 then comprise modular elements stackable in electrical connection at the terminals 12 to form a circuit of modular, reusable pieces that can be assembled and disassembled for later use as a reusable teaching tool. As the components 10 are interconnected at the posts 13, they are disposed horizontally. Spacers 17 are employed on the posts 13 as necessary to vertically extend a terminal post of an electrical component such that an electrical circuit may be constructed with components interconnecting in horizontal disposition. Each spacer 17 replicates a component terminal with a post 13 extending vertically from a spacer top side 18 and a receiving bore 19 under each post in a spacer bottom side 20 opposite the top side 18 adapted to disconnectably receive a post 13 from an interconnectable electrical component 10 in electrical connection.

The components 10 of the modular circuit assembly comprise a resistor 21, a capacitor 22, a switch 23, a photoresistor 24, a diode 25, or a light-emitting diode 26. Additional components may also be included. They further comprise surface-mounted electrical components 27 mounted on a uniform platform base 28 including a light bulb socket 29 into which a light bulb 30 is installed, a switch 31, a motor 32 perhaps with a fan 37, a capacitor 22, a speaker 38, a tuning circuit 39, a battery 40, or a microphone 41. Similarly, additional components may be included. The switch 31 may include a touching switch 32 including 2 exposed spaced-apart conducting plates 33 each connected to a terminal 12 and adapted for electrical connection therebetween by bridging the plates 33 with a conductor touching each plate respectively, or a dry reed tube 34 in which 2 conductors normally biased in spaced-apart relation are brought into contact by action of a magnet. Also included are components 35 having 3 electrical terminals 36 comprising a radio integrated circuit, a PNP or NPN semiconductor triode, or a variable resistor. Similarly included are circuits 53 having 4 or more electrical terminals comprising a musical integrated circuit, an alarm integrated circuit, or a low frequency amplifier integrated circuit. Likewise, other components may be included.

When there are electrical components 35 with 3 electrical terminals 12 connected to the component, 2 of said terminals 42 are spaced apart on the base twice the standard distance. The third terminal 43 is orthogonally spaced apart from an imaginary line connecting the said 2 terminals the standard distance.

When there are 4 or more electrical terminals connected to the component, a first pair of said terminals 44 are spaced apart on the base twice the standard distance, and a second pair of said terminals 45 are orthogonally spaced apart the standard distance from an imaginary line connecting the said first pair of terminals 44. The second pair of terminals 45 are also mutually spaced apart twice the standard distance.

The modular circuit assembly further comprises an assembly board 46 with a matrix of depending pegs 47 adapted to receive electrical components 10 with terminal receiving bores 15 disposed over the pegs 47. The depending pegs 47 are at intersections of uniformly-spaced orthogonally intersecting imaginary lines positioned to receive and attach electrical components 10 and the pegs 47 are sized and spaced equivalent to terminal posts 12 spaced-apart on electrical components 10. The electrical components 10 mounted are then assembled on the assembly board pegs 47 at the component terminals 12. So that these components 10 will mount on the assemble board 46 without interference with the assembly board pegs 47, all components 10 have bores 15 on their bottom side 16 spaced apart the standard distance.

A set of connecting wires 48 in the uniform base 11 is included in the modular circuit assembly with terminals 12 spaced apart twice the standard distance so electrical components 10 may be electrically connected with these wires in addition to direct component interconnection. To accommodate connections with components of multiple terminals and to provide further versatility in assembly of various circuits, a second set of connecting wires 49 in a second uniform base 50 is included with terminals spaced apart twice the standard distance.

A circuit design guide sheet 51 can be included to direct a user in the assembly of a candidate circuit. For example, in combination with a transparent assembly board 46, a guide sheet 51 diagramming interconnection of selective components 10 and wires 48, 49 may be placed on an assembly board side opposite the board pegs 47. A user then simply follows the guide sheet 51 by placing various selected components 10 on the board 46 over the guide 51 visible through the board 46 to form the electrical circuit diagrammed by the guide 51. The guide 51 may be colored coded with the components to further simplify and facilitate assembly and substitution of components. For example, power source components may be colored red, and the guide would be colored red in the location where the power source should be mounted on the assembly board 46. All switch components might be colored green and switches on the guide are correspondingly colored green; a user would select a switch and mount it on the board over a green designation on the guide. To further educate, colored guide locations for the selective components are indicated in recognizable insignia 52 for the component, such as for a a battery, a switch, or a motor. Similarly, groups of electrical components are provided in characteristic colors duplicated on the guide so a user may be directed by the colors of the components in assembling a circuit.

One skilled in the art will recognize the advantages taught by this invention and illustrated by the preferred embodiment presented. The specification and drawings are not intended to represent an exhaustive description of the invention or the components thereof. Clearly, for example, additional circuit components can be added to the assembly. Obvious applications and extensions of the invention are intended to be within the spirit and scope of this invention.

Having described the invention, what is claimed is:

1. An electrical circuit assembly comprising, a circuit assembly board including a plurality of depending pegs throughout the board mutually spaced apart equally a standard distance therein forming a coordinated orthogonal matrix for removably mounting electrical circuit components thereon selectively throughout the board, a plurality of interconnectable electrical components, comprising a first component set adapted to mount on the board, each component thereof encased in a base uniform in size and shape so each component can be mechanically substituted for another and each component having 2 electrical terminals spaced apart on the base twice said standard distance for mounting at a selective position throughout the board, wherein the terminals further comprise a post in size and shape equivalent to each board peg and extending vertically from a base top side and a receiving bore under each post in a base bottom side opposite the top side adapted to disconnectably receive a board peg or a terminal post from another component in electrical connection, and wherein a selective portion of the plurality of electrical components, including a power source component, are all connected with said post of one said component received in said receiving bore of another component until all components are connected in a closed electrical circuit horizontally dispersed about the board.

2. The circuit assembly of claim 1 further comprising a second component set adapted to mount on the board, each component thereof encased in a base uniform in size and shade so each component can be mechanically substituted for another and each said component including 3 electrical terminals connected to the component with 2 of said terminals being spaced apart on the base twice the standard distance with the third terminal being orthogonally spaced apart from a line connecting the said 2 terminals said standard distance, also adapted for mounting at a selective position throughout the board.

3. The circuit assembly of claim 2 in which one or more of the interconnectable electrical components respectively encased in a uniform base including 3 electrical terminals comprises a radio integrated circuit.

4. The circuit assembly of claim 1 further comprising a third component set adapted to mount on the board, each component thereof encased in a rectangular base uniform in size and shape so each component can be mechanically substituted for another and each said component having 4 electrical terminals connected to the component with 2 first pairs of said terminals being spaced apart on a base twice the standard distance and with 2 second pairs of said terminals being spaced apart said standard distance.

5. The circuit assembly of claim 4 in which one or more of the interconnectable electrical components encased in a uniform rectangular base having 4 electrical terminals comprises a musical integrated circuit, an alarm integrated circuit, or a low frequency amplifier integrated circuit.

6. The modular circuit assembly of claim 1 in which one or more in the plurality of electrical components encased in a uniform base comprises a switch, a photoresistor, a diode, or a light-emitting diode.

7. The modular circuit assembly of claim 1 further comprising a set of surface-mounted electrical components mounted on a uniform platform base, the set including a light bulb socket into which a light bulb is installed, a switch, a motor, a tuning circuit, or a microphone.

8. The assembly of claim 1 in which the electrical component base has a third receiving bore said standard distance between each other receiving bore for receiving a board peg.

9. An electrical circuit assembly comprising, a plurality of interconnectable electrical components each component thereof encased in a uniform base and having 2 electrical terminals spaced apart on the base and adapted for interconnection with the base of each component in horizontal disposition, electrical spacers including a terminal comprising a post extending vertically from a spacer top side and a receiving bore under each post in a spacer bottom side opposite the top side adapted to disconnectably receive a post from an interconnectable electrical component in electrical connection, adapted to vertically extend a terminal post of an electrical component such that an electrical circuit may be constructed with components interconnecting in horizontal disposition.

10. A modular electrical circuit assembly comprising, a plurality of interconnectable electrical components each encased in a uniform base and having 2 or more electrical terminals connected to each component spaced apart on the base said components including a surface-mounted touching switch including 2 exposed spaced-apart conducting plates each connected to a terminal and adapted for electrical connection therebetween by bridging the plates with a conductor touching each plate respectively, or a dry reed tube in which 2 conductors normally biased in spaced-apart relation are brought into contact by action of a magnet.

11. An electrical circuit assembly comprising, a plurality of interconnectable electrical components each encased in a uniform base and having 2 or more electrical terminals connected to each component spaced apart on the base, an assembly board with a matrix of depending pegs adapted to receive electrical components with terminal bores disposed over the pegs in combination with a circuit design guide sheet depicting selective components for directing a user in the assembly of a candidate circuit, the sheet disposable on a board side opposite the pegs.

12. The modular circuit assembly of claim 11 in which components of similar circuit effect are grouped and similarly colored, and the guide is colored-coded with colors of the several components, or selective components from respective groups, depicted on the guide corresponding to the color of the component or group of similar components.

13. The modular circuit assembly of claim 12 in which the components depicted on the colored guide are indicated in recognizable insignia for the components, respectively.

14. The modular circuit assembly of claim 13 in which each component includes the recognizable insignia visible thereon corresponding to the respective component matching insignia on the guide.

15. The method of forming a modular electrical circuit adapted for repeated assembly and disassembly from an assembly of interconnectable electrical components and a circuit assembly board including a plurality of depending pegs disposed throughout the board and mutually spaced apart equally a standard distance therein forming a coordinated orthogonal matrix for removably mounting electrical circuit components thereon selectively throughout the board, and where the electrical components comprise a first component set adapted to mount on the board, each component thereof encased in a base uniform in size and shade so each component can be mechanically substituted for another and each component having 2 electrical terminals spaced apart on the base twice said standard distance for mounting at a selective position throughout the board, wherein the terminals further comprise a post in size and shape similar to each board peg and extending vertically from a base top side and a receiving bore under each post in a base bottom side opposite the top side adapted to disconnectably receive a board peg or a terminal post from another component in electrical connection, and wherein a selective portion of the plurality of electrical components, including a power source component, are all connected with said post of one said component received in said receiving bore of another component until all components are connected in a closed electrical circuit horizontally dispersed about the board, comprising the following steps:

a. disconnectably interconnecting 2 or more electrical components, including a power source, at their respective terminals;

b. repeating step (a) until a closed electrical circuit is achieved.

16. The method of forming an electrical circuit adapted for repeated assembly and disassembly from an assembly of interconnectable electrical components each encased in a uniform base and having 2 or more electrical terminals connected to each component spaced apart on the base and in which terminals include disconnectable electrical spacers including a terminal comprising a post extending vertically from a spacer top side and a receiving bore under each post in a spacer bottom side opposite the top side adapted to disconnectably receive a post from an interconnectable electrical component in electrical connection, adapted to vertically extend a terminal post of an electrical component, comprising a. disconnectably interconnecting 2 or more electrical components, including a power source, at their respective terminals, selectively stacking components at respective component terminals including as required the further step of installing a spacer on a terminal of a first electrical component and installing the terminal of a second electrical component on the spacer such that interconnecting circuit electrical components are disposed horizontally b. repeating step (a) until a closed electrical circuit is achieved.

\* \* \* \* \*